United States Patent Office 2,696,435

Patented Dec. 7, 1954

2,696,435

LITHOGRAPHIC MATERIAL AND PROCESS

Wilhelm Neugebauer and Martha Tomanek, Wiesbaden-Biebrich, Germany, assignors, by mesne assignments, to Azoplate Corporation, Summit, N. J., a corporation of New Jersey No Drawing. Application March 5, 1952, Serial No. 275,026

Claims priority, application Germany March 10, 1951

12 Claims. (Cl. 95—7)

The present invention relates to new light-sensitive layers for use in the field of photomechanical reproduction. More particularly it relates to the production of light-sensitive material with the aid of unsaturated aromatic sulfones and to a process of transforming said light-sensitive material into ink-receptive images for use on printing plates.

For the purpose of producing printing plates photomechanically, light-sensitive colloid layers have hitherto been used to a great extent. Such colloidal substances as gum arabic, albumin and gelatin sensitized with chromates have been used. Light sensitive layers which do not contain colloids have been proposed recently for this purpose and light-sensitive diazo compounds are used as the light-sensitive substance in these types of layers which are free from chromates.

It has now been found that unsaturated sulfones conforming to the general formula $$R_1—SO_2—CH=CH—CH=CH—R_2$$

in which $R_1$ and $R_2$ represent a member selected from the group consisting of aromatic residues and substituted aromatic residues can be used for coating the base material which is intended for the photomechanical production of printing plates. Such plates are useful in graphic printing processes, in particular in planographic and offset printing.

The unsaturated sulfones to be used in accordance with this invention for the preparation of the layer required for the production of images, are sensitive to actinic light and the decomposition products which result from the exposure to light are oleophilic, hydrophobic substances. Consequently, it is possible to produce the light-sensitive layer without adding hardenable colloids. These unsaturated sulfones are obtained by condensing aromatic sulfonylacetic acids with aromatic unsaturated aldehydes in pyridine in the presence of piperidine (compare Chodroff and Whitmore, "Journal of the American Chemical Society," volume 72, March 1950, No. 3, pages 1073–1076).

The following are examples of unsaturated sulfones which may be used in accordance with this invention.

1.

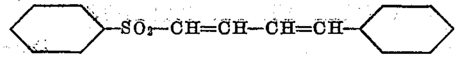

α-(Phenyl-sulfonyl)-β-styryl-ethylene (melting point=87°–88° C.).

2.

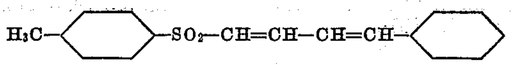

α-(p-Tolyl-sulfonyl)-β-styryl-ethylene (M. P.=134.5°–135.5° C.), described by Chodroff and Whitmore, "Journal of the American Chemical Society," volume 72, March 1950, No. 3, page 1075.

3.

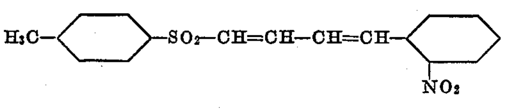

α-(p-Tolyl-sulfonyl)-β-(2-nitro-styryl)-ethylene (M. P.=150°–151° C.). This compound is obtained by condensation of p-tolyl-sulfonylacetic acid with 2-nitro-cinnamaldehyde.

4.

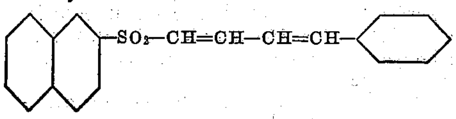

α-(2-naphthyl-sulfonyl)-β-styryl-ethylene (M. P.=125°–126° C.). This compound can be obtained by condensation of β-naphthyl-sulfonylacetic acid with cinnamaldehyde.

5.

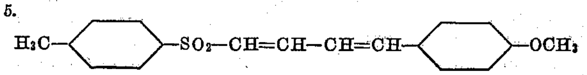

α-(p-Tolyl-sulfonyl)-β-(4-methoxy-styryl)-ethylene (M. P.=119°–121° C.). This compound is obtained by condensation of p-tolyl-sulfonylacetic acid with 4-methoxy-cinnamaldehyde.

The light-sensitive material is produced with the aid of unsaturated sulfones in accordance with this invention as follows: Solutions of the sulfones in question are applied to a suitable base material which is preferably flexible so that it can be made to conform to the printing cylinder—for example, a thin aluminum plate or aluminum foil is suitable. The surface of the material may be provided with a chemically or electrochemically produced thin layer of aluminum oxide or the like or may be roughened mechanically to increase adhesion of the light-sensitive layer. The solution can be applied, for example, by means of a plate whirler and afterwards the coated material is dried. Organic solvents, such as alcohols, glycol-monomethyl-ether, dioxane, pyridine, benzene, or mixtures of solvents are used for making the coating solutions. It is possible also to apply mixtures containing several of the unsaturated sulfones to be used according to this invention for forming the light sensitive layer on the base material.

In order to produce printing plates from the light sensitive material thus obtained, the coated surface is exposed to actinic light under a master. The exposure can be performed, for example, by means of an arc lamp or a mercury vapor lamp. In the course of this procedure the yellow-colored unsaturated sulfones bleach at the places struck by light.

The image obtained in this manner is treated with dilute acid, e. g. phosphoric acid, and is subsequently rubbed in with greasy ink in the presence of a little water. Only the areas struck by light are ink-receptive while the ink is repelled at those places that were not affected by light. However, it is possible also to rub in the exposed material simultaneously with greasy ink and with dilute acid or to rub the surface with the greasy ink first and then to treat the material with dilute acid. In this way there are obtained positive images and printing plates from negative masters, or negative images and printing plates if positive masters are used.

The following examples are inserted for the purpose of illustrating the above described invention, the scope of which is not intended to be limited thereby.

1. The solution of 2.5 parts of α-(p-tolyl-sulfonyl)-β-(2-nitro-styryl)-ethylene (Formula 3) in 100 parts of alcohol is applied to an anodically oxidized aluminum foil, e. g. by means of a plate whirler, and is then dried. The coated side of the dried material is exposed to light under a negative master (for approximately 2 minutes at a distance of 60 cm., if an arc lamp of 18 amperes is employed), the exposed layer is then developed by wiping with a 1% solution of phosphoric acid, and the developed surface of the foil is rubbed in with greasy ink. A positive image is obtained, which can be used for printing after the printing plate has been mounted on an offset printing machine.

2. The same procedure is followed as that described in Example 1, except that the aluminum foil is coated with a solution containing a mixture composed of 1.5 parts of α-(phenyl-sulfonyl)-β-styryl-ethylene (Formula 1) and 1.5 parts of α-(p-tolyl-sulfonyl)-β-styryl-ethylene (Formula 2) in 100 parts of glycol-mono-methyl-ether. In this case also a positive image is obtained on further processing.

3. To an aluminum plate, which may be mechanically roughened, there is applied a solution of 2 parts of α-(2-naphthyl-sulfonyl)-β-styryl-ethylene (Formula 4) in 100 parts of a 1:1 mixture of dioxane and alcohol to form a thin coating on the plate. The coated plate is then dried and exposed to light under a negative master and the exposed surface of the plate is rubbed in simultaneously with greasy ink and a 1% solution of sulfuric acid. A positive image is obtained which may be used as a positive printing plate.

4. A 2% solution of α-(p-tolyl-sulfonyl)-β-(4-methoxy-styryl)-ethylene (Formula 5) in alcohol is coated onto a superficially roughened aluminum foil and then the procedure outlined in Example 1 is followed, except that the exposed layer is developed by first rubbing it with greasy ink and then applying a 1% solution of phosphoric acid. Positive printing plates are obtained from negative masters.

Having thus described the invention, what is claimed is:

1. Light sensitive material suitable for making printing plates comprising a flexible sheet metal base coated with a thin, firm and uniform layer of an unsaturated sulfone having the general formula $$R_1—SO_2—CH=CH—CH=CH—R_2$$

in which $R_1$ and $R_2$ are selected from the group consisting of aromatic residues and substituted aromatic residues.

2. Light sensitive material suitable for making printing plates comprising a flexible aluminum base sheet coated with a thin, firm and uniform layer of an unsaturated sulfone having the general formula $$R_1—SO_2—CH=CH—CH=CH—R_2$$

in which $R_1$ and $R_2$ are selected from the group consisting of aromatic residues and substituted aromatic residues.

3. Light sensitive material suitable for making printing plates comprising a flexible aluminum base sheet having an oxidized surface coated with a thin, firm and uniform layer of an unsaturated sulfone having the general formula $$R_1—SO_2—CH=CH—CH=CH—R_2$$

in which $R_1$ and $R_2$ are selected from the group consisting of aromatic residues and substituted aromatic residues.

4. Light sensitive material suitable for making printing plates comprising a flexible sheet metal base coated with a thin, firm and uniform layer of an unsaturated sulfone having the general formula $$R_1—SO_2—CH=CH—CH=CH—R_2$$

in which $R_1$ and $R_2$ are selected from the group consisting of benzene residues, naphthalene residues, substituted benzene residues and substituted naphthalene residues.

5. Light sensitive material suitable for making printing plates comprising a flexible sheet metal base coated with a thin, firm and uniform layer of the compound having the formula

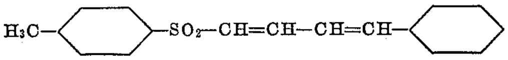

6. Light sensitive material suitable for making printing plates comprising a flexible sheet metal base coated with a thin, firm and uniform layer of the compound having the formula

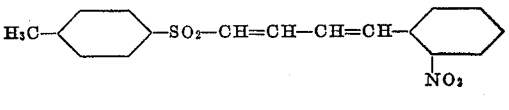

7. Light sensitive material suitable for making printing plates comprising a flexible sheet metal base coated with a thin, firm and uniform layer of the compound having the formula

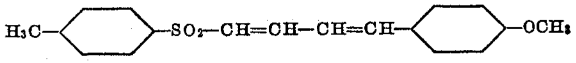

8. Light sensitive material suitable for making printing plates comprising a flexible sheet metal base coated with a thin, firm and uniform layer of the compound having the formula

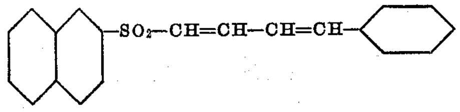

9. The method of making printing plates from a flexible base sheet coated with a thin, firm and uniform layer of an unsaturated sulfone having the general formula $$R_1—SO_2—CH=CH—CH=CH—R_2$$

in which $R_1$ and $R_2$ are selected from the group consisting of aromatic residues and substituted aromatic residues comprising the steps of exposing said material to a light image, treating the exposed material with dilute acid and applying ink in the presence of water.

10. The method of making printing plates comprising the steps of coating a flexible base sheet with a thin, firm and uniform layer of an unsaturated sulfone having the general formula $$R_1—SO_2—CH=CH—CH=CH—R_2$$

in which $R_1$ and $R_2$ are selected from the group consisting of aromatic residues and substituted aromatic residues exposing said material to a light image, treating the exposed material with dilute acid and applying ink in the presence of water.

11. A printing plate consisting of a flexible sheet metal base and a light produced image on said sheet, said image comprising light decomposition product of at least one unsaturated sulfone of the formula $$R_1—SO_2—CH=CH—CH=CH—R_2$$

wherein $R_1$ is a member of the group consisting of benzene, naphthalene, substituted benzene, and substituted naphthalene residues, and $R_2$ is a member of the group consisting of benzene and substituted benzene residues.

12. The method of making a printing plate comprising the steps of coating a thin sheet of metal with a solution comprising unsaturated sulfone dissolved in an organic solvent, said sulfone having the general formula $$R_1—SO_2—CH=CH—CH=CH—R_2$$

wherein $R_1$ is a member of the group consisting of benzene, naphthalene, substituted benzene, and substituted naphthalene radicals, and $R_2$ is a member of the group consisting of benzene and substituted benzene radicals, forming a thin and firm film on said sheet by evaporating said solvent from said solution, exposing said film to light through a pattern, developing the resulting image with dilute acid, and applying greasy ink on said image.

References Cited in the file of this patent

UNITED STATES PATENTS

| Number | Name | Date |
|---|---|---|
| 2,257,969 | Loane et al. ____________ | Oct. 7, 1941 |

OTHER REFERENCES

Chodroff et al., J. A. C. S., vol. 72, March 1950, No. 3, pages 1073–1076.